United States Patent [19]

Ohkase

[11] Patent Number: 4,952,115
[45] Date of Patent: Aug. 28, 1990

[54] WAFER SUPPORT DEVICE

[75] Inventor: Wataru Ohkase, Sagamihara, Japan

[73] Assignee: Tel Sagami Limited, Kanagawa, Japan

[21] Appl. No.: 315,311

[22] Filed: Feb. 24, 1989

[30] Foreign Application Priority Data

Feb. 29, 1988 [JP] Japan .................................. 63-46048

[51] Int. Cl.$^5$ .............................................. B65G 65/00
[52] U.S. Cl. .................................... 414/618; 414/404; 414/416; 414/417
[58] Field of Search ............... 414/403, 404, 416, 417, 414/618, 626

[56] References Cited

U.S. PATENT DOCUMENTS

| | | | |
|---|---|---|---|
| 4,244,673 | 1/1981 | Henderson | 414/786 X |
| 4,311,427 | 1/1982 | Coad et al. | 414/417 X |
| 4,493,606 | 1/1985 | Foulke et al. | 414/416 X |
| 4,568,234 | 2/1986 | Lee et al. | 414/786 X |

FOREIGN PATENT DOCUMENTS

| | | |
|---|---|---|
| 5775749 | 5/1982 | Japan . |
| 59-219937 | 12/1984 | Japan . |
| 6336137 | 7/1988 | Japan . |

*Primary Examiner*—David A. Bucci
*Assistant Examiner*—Cheryl L. Gastineau
*Attorney, Agent, or Firm*—Oblon, Spivak, McClelland, Maier & Neustadt

[57] ABSTRACT

A wafer support device including at least one support member shaped like a rotatable rod and having plural wafer support grooves formed at different pitches on the outer surface of the member in the longitudinal direction thereof. The frequencies of exchanging the support member with a new one or washing and cleaning it can be remarkably reduced and the productivity of semi-conductor wafers can be enhanced.

7 Claims, 3 Drawing Sheets

WAFER SUPPORT DEVICE

BACKGROUND OF THE INVENTION

1. Field of the Invention

The present invention relates to a wafer support device capable of being incorporated into devices for transferring semiconductor wafers (which will be hereinafter referred to as wafers) to and from wafer boats or the like.

2. Description of the Related Art

In the course of manufacturing semiconductor integrated circuits, particularly in the processes of diffusing, oxidizing and CVD-treating wafers, it is preferable that these processes be conducted under clean circumstances with clean equipment and without using human hands since they tend to be sources for generating dust. When these processes are conducted in this manner, circuit elements of high density and quality can be produced. Various kinds of wafer carrying devices are used to this end. When wafers are to be heated, they are picked up directly from a carrier and transferred to a wafer boat made of quartz. They are then carried to a heat treatment furnace. There is also a case where they are once moved from the carrier to a buffer and then transferred from the buffer to the boat. They are further carried to the predetermined processing apparatus by the boat and subjected to the various manufacturing processes there. The manufacturing and processing apparatuses include those of the batch type and of the continuation type and they are grouped into the ones for processing wafers vertically supported and the ones for processing wafers horizontally supported.

In the case of the manufacturing and processing apparatus of the batch type, the transfer of wafers is attained by such a device as shown in FIG. 1. Numeral 1 represents a support member having a curved top. Support member 1 supports plural wafers (W), which are housed in carrier 4, from below in groove 2 formed on the curved top thereof. When it is driven by driver means 3, support member 1 lifts plural wafers (W) or 25 pieces of wafers (W) above carrier 4 at the same time. Wafers (W) kept under this state are held between holder member 5, which transfers wafers (W) from carrier 4 to a boat (not shown). After being processed, wafers (W) are transferred from the boat to the carrier. When any of the wafers (W) are broken during the transferring, however, broken pieces of the wafer adhere to support member 1. When multistage furnaces are used and the manufacturing process conducted in each of the reaction furnaces is different from the others, components of wafers (W) processed in the previous reaction furnace become impurities, which also adhere to support member 1 and holder member 5. This makes it necessary to use new support and holder members for every manufacturing and processing apparatus or to prepare plural support and holder members for both of wafers (W) not processed yet and those processed. Further, the support and holder members must be washed and cleaned every time when the processing of wafers (W) is finished. The washing and cleaning of the support and holder members are so troublesome as to reduce the productivity of the manufacturing and processing apparatuses.

SUMMARY OF THE INVENTION

The object of the present invention is therefore to provide a wafer support device capable of remarkably reducing the frequencies of exchanging the support member with a new one and washing and cleaning it to enhance the productivity of semiconductor wafer manufacturing apparatuses.

This object of the present invention can be achieved by a wafer support device comprising at least one support member shaped like a rotatable rod and having a row of wafer support grooves formed at a certain pitch on the outer surface of the member in the longitudinal direction thereof and also having another row of wafer support grooves formed at a pitch different or the same from the above-mentioned pitch on the outer surface of the member in the longitudinal direction thereof; a mechanism for rotating and selecting the desired support member; a member for holding the support member; and a means for carrying the support member in a predetermined direction.

BRIEF DESCRIPTION OF THE DRAWINGS

FIG. 1 is intended to explain the conventional lifter means used to transfer wafers to and from the boat or the like;

DETAILED DESCRIPTION OF THE PREFERRED EMBODIMENTS

Figure 1:
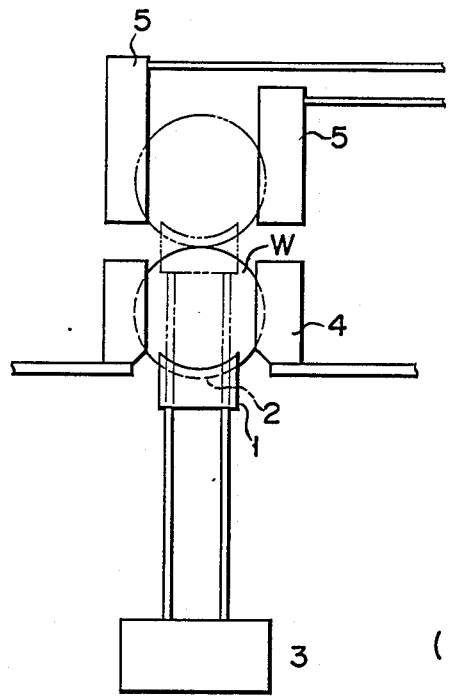
Figure 2:
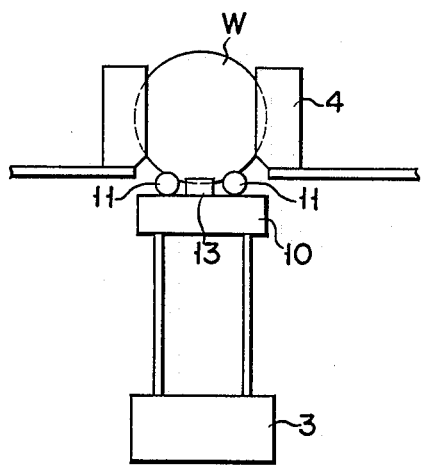
FIG. 2 shows an embodiment of the present invention.
Figure 3:
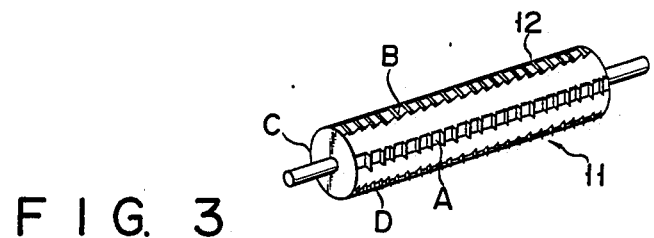
FIG. 3 is a perspective view showing a support member employed by the lifter means in FIG. 2.

FIG. 2 shows an example of the wafer support device according to the present invention, which is incorporated into the lifter device for transferring wafers to and from something like the wafer carriage boat, for example. The same parts as those of the conventional lifter device shown in FIG. 1 will be denoted by the same reference numerals. Reference numeral 10 in FIG. 2 represents a driven member, which is connected to driver system 3 such as an air cylinder and motor. Driven member 10 cooperates with drive system 3 to form a drive means for moving wafers and down. As shown in FIG. 3, a pair of wafer support rollers 11 are mounted, rotatable, on driven member 10. These rollers 11 are connected to a rotation system (not shown) such as a motor and solenoid, which causes rollers 11 to be rotated by the same angle or 90°, for example, at the same time. Grooves 12 are formed on the outer circumference of each of the wafer support rollers 11 at a certain interval and along four longitudinal directions A, B, C and D thereof which are separated from each other at a certain interval and in the circumferential direction of roller 11. When wafer support rollers 11 are rotated every 90° by the rotation system, those positions of rollers 11 at which wafers are supported can be changed from grooves 12 along longitudinal direction A of rollers 11 to the ones along direction B thereof, then to the ones along direction C thereof and further then to the one along direction D. The pitches of the grooves are selected in accordance with a sort of treatment such as oxidation, diffusion or CVD. Grooves 12 may be formed on the outer circumference of each of the rollers 11 along not four but three longitudinal directions thereof.

Figure 4:
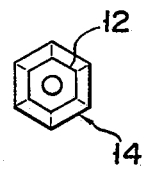
FIG. 4 shows a wafer support roller hexagonal in section.

Wafer support roller 11 is made of ethylene chloride, liquid ethylene trifluoride, quartz or aluminum. The shape of roller 11 is not limited to the column shown in FIG. 3, but roller 11 may be hexagonal in section, as shown in FIG. 4. When it is polygonal in section, grooves 12 into which circumferential rims of the wafers are fitted may be formed on it along every corner of its section. It is needed only to allow grooves 12, in which wafers can be supported, to be formed on its outer circumference. This enables it to be rectangular, pentagonal or other in section. The number of rows of grooves 12 on its outer circumference may be appropriately selected depending upon how many times the wafers must be processed.

Figure 5:
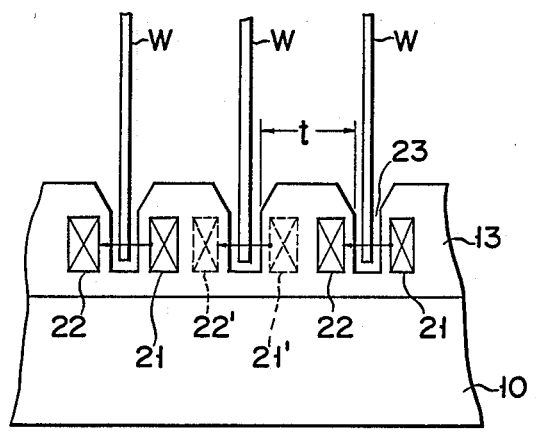
FIG. 5 shows a counter mounted on a driven member.

Counter 13 for counting supported wafers can be attached onto driven member 10 on which wafer support rollers 11 are also supported. Counter 13 is located on driven member 10 between rollers 11. As shown in FIG. 5, counter 13 has grooves 23 which are aligned with their corresponding grooves 12 on wafer support rollers 11. A wafer detector means of the photo-coupling type comprising light emitting and receiving elements is embedded in those walls of counter 13 between which groove 23 is formed. Counter 13 detects whether or not wafers are present in grooves 12, using light emitting and receiving elements 21 and 22 embedded to correspond to each of grooves 12. This enables counter 13 to count the number of wafers supported on rollers 11 and also to detect those grooves on rollers 11 in which no wafer is present. The thickness of each of those walls on counter 13 between which groove 23 is formed is extremely small or about 4.7625 mm, for example. The light emitting and receiving elements are therefore arranged in zigzag in such a way that one pair of them are located at the front side of the walls on counter 13 and that another pair of them at the back side thereof.

Wafers or 25 pieces of wafers housed in a cassette can be supported in grooves 12 along longitudinal direction A on paired wafer support rollers 11 at one time. Driven member 10 is then moved upward by driver system 3 to lift wafers (W) above the cassette. 25 pieces of wafers (W) thus located above the cassette are held at the same time between a holder member (not shown) at both right and left ides of wafers (W) and transferred to a boat made of quartz or the like in which 100 pieces of wafers, for example, can be supported. This process is repeated four times and 100 pieces of wafers (W) are transferred from four cassettes to the boat.

The boat in which 100 pieces of wafers (W) are supported is then carried into the semiconductor making and processing apparatus or reaction tube and wafers (W) in the boat are subjected to predetermined processes including oxidizing, diffusing and heating processes, for example. After these processes, wafers (W) in the boat are carried from the semiconductor making and processing apparatus to wafer support rollers 11 where they are held between the holder member and transferred onto wafer support rollers 11. Paired wafer support rollers 11 are rotated by 90° this time to support wafers (W) in grooves 12 along longitudinal direction B thereon. In short, grooves 12 for supporting wafers (W) are changed from those along longitudinal direction A on the paired rollers 11 to the ones along longitudinal direction B thereon. This changeover of grooves 12 can be automatically attained when a driver means of the rotation system is previously programmed. Driven member 10 is then moved downward by driver system 3 to house wafers (W) in carrier or cassette 4. When wafers (W) which are not processed yet are again supported on paired rollers 11, they are supported in grooves 12 along longitudinal direction A on rollers 11 but after processed, they are supported in grooves 12 along longitudinal direction B on paired rollers 11. This can prevent new wafers on paired rollers 11 from being stained by matters reacted with processed wafers. In addition, this makes it unnecessary to wash and clean the wafer support rollers every time when wafers are processed. When wafers (W) are damaged while being carried, wafer support rollers 11 may be immediately rotated to change grooves 12 along one longitudinal direction on rollers 11 to those along another longitudinal direction thereon. In a case where wafers (W) are to be carried after other semiconductor making processes, wafer support rollers 11 are further rotated by 90° to support wafers (W) in grooves 12 along longitudinal direction C on rollers 11.

According to the lifter device of the present invention as described above, grooves on the paired wafer support rollers can be changed from those along one longitudinal direction on the rollers to the ones along any of the other longitudinal directions thereon after the wafers are processed, or every wafer process, or whenever any of the wafers is damaged or soiled. It therefore becomes unnecessary to exchange the wafer support rollers with new ones or to wash and clean them after every wafer process or whenever any of the wafers is damaged or soiled. This enables space and labor for the device to be saved and the productivity of semiconductors to be remarkably enhanced.

Figure 6:
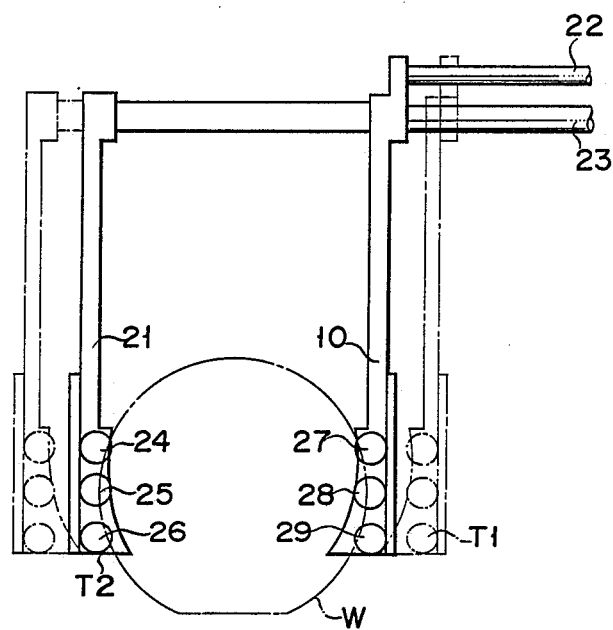
FIG. 6 shows a wafer holder means to which the present invention is applied.

The wafer support device of the present invention can be incorporated into such a wafer holder device as shown in FIG. 6. The upper ends of roller support members 20 and 21 are connected to the driver system (not shown) through rods 22 and 23. Three column-like support rollers 24-26 or 27-29 are arranged parallel to each other at the lower portion of roller support member 20 or 21 with a certain interval interposed between the rollers in the vertical direction. These roller 24-26 and 27-29 prevent wafers (W) from falling and rollers 25 and 28 serve to guide wafers (W) between rollers 26 and 29 and between rollers 24 and 27. Each of the support rollers 24-29 is provided with the same grooves as those 12 shown in FIG. 3. These support rollers 25-29 are rotated every 90° synchronizing with one another by means of the driver means or stepping motor (not shown).

Figure 7:
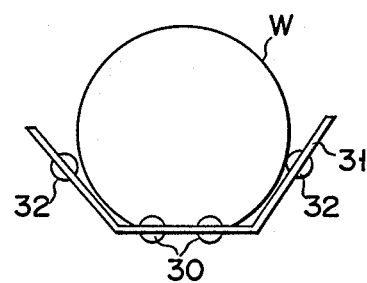
FIG. 7 shows a wafer boat to which the present invention is applied.

The wafer support device of the present invention can be applied to boat 35 as shown in FIG. 7. A pair of support members 30 same as the one shown in FIG. 3 are arranged on the bottom of frame 31 of boat 35. Support rollers 32 which are contacted with circumferential rims of wafers (W) are arranged on both sides of frame 31 in this case.

The same arrangement of the groove pitches may be used and one of the groove pitches is selected for each treatment with each support member.

What is claimed is:

1. A wafer support device comprising:
    at least one support member shaped line a rotatable rod and having a row of wafer support grooves formed at a certain pitch on the outer surface of said member in the longitudinal direction thereof and also having another row of wafer support grooves formed on the outer surface of said member in the longitudinal direction thereof;

a mechanism for rotating the support member so as to select in which of said rows of wafer support grooves a wafer is supported a member for holding said support member; and a means for raising and lowering said support member.

2. The wafer support device according to claim 1, wherein said holder member is a member driven up and down.

3. The wafer support device according to claim 1, wherein said holder member is a means for sandwiching wafers between it.

4. The wafer support device according to claim 1, wherein said holder member is a frame for forming a wafer boat.

5. The wafer support device according to claim 1, wherein said support member is made of ethylene chloride, ethylene trifluoride, quartz or aluminum.

6. The wafer support device according to claim 1, wherein said support member is polygonal in section.

7. The wafer support device according to claim 1, wherein a wafer counter is arranged on a driven member.

* * * * *